United States Patent
Mokerji

Patent Number: 6,096,426
Date of Patent: *Aug. 1, 2000

[54] COATING HAVING THE APPEARANCE OF BLACK CHROME

[75] Inventor: Subrata Mokerji, Shelby Township, Mich.

[73] Assignee: MascoTech, Inc., Taylor, Mich.

[*] Notice: This patent is subject to a terminal disclaimer.

[21] Appl. No.: 08/905,882

[22] Filed: Aug. 1, 1997

[51] Int. Cl.[7] ..................................................... B32B 15/04
[52] U.S. Cl. .......................... 428/412; 428/457; 428/458; 428/461; 428/462
[58] Field of Search .................... 428/457, 458, 428/461, 462, 412

[56] References Cited

U.S. PATENT DOCUMENTS

| | | | |
|---|---|---|---|
| 3,838,512 | 10/1974 | Sanderson | 30/346.54 |
| 3,977,839 | 8/1976 | Palisin, Jr. | 428/626 |
| 4,109,052 | 8/1978 | Anderson | 428/409 |
| 4,148,967 | 4/1979 | Satoh et al. | 428/416 |
| 4,305,981 | 12/1981 | Muroi et al. | 428/31 |
| 4,321,299 | 3/1982 | Frosch et al. | 442/379 |
| 4,369,225 | 1/1983 | Manabe | 428/334 |
| 4,374,717 | 2/1983 | Drauglis | 204/192 C |
| 4,911,811 | 3/1990 | Mullaney | 204/192.14 |
| 4,931,366 | 6/1990 | Mullaney, Jr. | 428/622 |
| 5,510,164 | 4/1996 | Best et al. | 428/64.1 |
| 5,589,280 | 12/1996 | Gibbons et al. | 428/626 |
| 5,656,335 | 8/1997 | Schwing et al. | 427/447 |

*Primary Examiner*—Leszek Kiliman
*Attorney, Agent, or Firm*—Myron B. Kapustij; Lloyd D. Doigan

[57] ABSTRACT

An article is coated with a multi-layer coating comprising a polymeric layer deposited on the surface of the article, a chrome/nickel alloy layer deposited on the polymeric layer, and an acrylic layer deposited on the chrome/nickel alloy layer.

9 Claims, 1 Drawing Sheet

COATING HAVING THE APPEARANCE OF BLACK CHROME

FIELD OF THE INVENTION

The instant invention relates to a substrate having a leveling plastic coating thereon, a decorative chrome/nickel alloy layer on the plastic coating, and a polyurethane or acrylic coating over the chrome layer.

SUMMARY OF THE INVENTION

In accordance with this invention a plastic basecoat is provided on the surface of the substrate. The polymeric basecoat provides a leveling effect to the surface of the substrate. A decorative chrome/nickel alloy layer is then applied onto the basecoat. A polyurethane or acrylic top coat is provided over the chrome layer. This top coat functions both as a protective coating for the underlying chrome/nickel alloy layer and to provide the appearance of black chrome to the coated chrome/nickel alloy layer.

BACKGROUND OF THE INVENTION

Thin chrome layers have been applied by electroplating or vapor deposition onto the surfaces of various substrates to provide a decorative and shiny silvery appearance thereto. However, the substrates have had to be pretreated as by polishing, cleaning and the like to remove any scratches or other imperfections from their surfaces before the chrome layer is applied thereon. Otherwise, the chrome layer will enhance and accentuate these imperfections. Also, the chrome layer is subject to abrasion, scratching and weathering, particularly if it is applied onto a part of a vehicle such as, for example, a wheel cover.

The present invention provides a substrate with a decorative coating having the appearance of black chrome which is not subject to the afore-mentioned disadvantages.

DESCRIPTION OF THE PREFERRED EMBODIMENT

Figure 1:
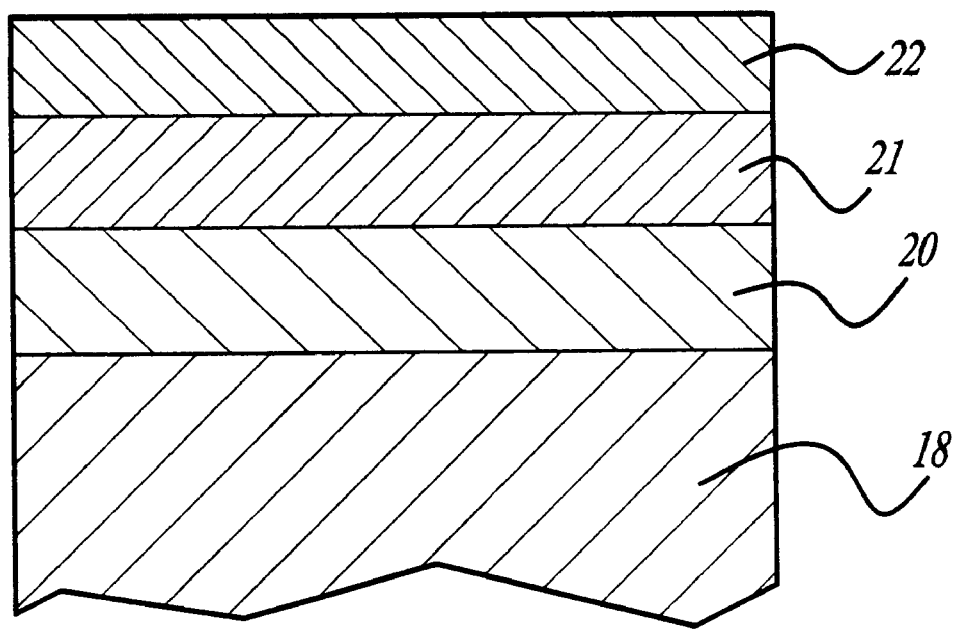
FIG. 1 is a cross-sectional view, not to scale of a portion of the substrate having the multi-layer coating on its surface.

The article or substrate 18 can be comprised of any suitable material such as plastic, ceramic, metal or metal alloy. The metals include nickel, aluminum, copper, steel and zinc. The metal alloys include nickel alloys and brass. The plastics forming the substrate include polycarbonates, nylon, acrylonitrile-butadiene-styrene, polyesters, polyvinylchlorides, and the like. In one embodiment the article is part of a vehicle, such as for example, a wheel cover.

Over the surface of the substrate 18 is deposited a polymeric or resinous layer 20. The polymeric or resinous layer or basecoat 20 may be comprised of both thermoplastic and thermoset polymeric or resinous material. These polymeric or resinous materials include the well known, conventional and commercially available polycarbonates, polyacrylates, polymethacrylates, nylons, polyesters, polypropylenes, polyepoxies, alkyds and styrene containing polymers such as polystyrene, styrene-acrylonitrile (SAN), styrene-butadiene, acrylonitrile-butadiene-styrene (ABS), and blends and copolymers thereof.

The polycarbonates are described in U.S. Pat. Nos. 4,579,910 and 4,513,037, both of which are incorporated herein by reference.

Nylons are polyamides which can be prepared by the reaction of diamines with dicarboxylic acids. The diamines and dicarboxylic acids which are generally utilized in preparing nylons generally contain from two to about 12 carbon atoms. Nylons can also be prepared by additional polymerization. They are described in "Polyamide Resins", D. E. Floyd, Reinhold Publishing Corp., New York, 1958, which is incorporated herein by reference.

The polyepoxies are disclosed in "Epoxy Resins", by H. Lee and K. Neville, McGraw-Hill, New York, 1957, and in U.S. Pat. Nos. 2,633,458; 4,988,572; 4,680,076; 4,933,429 and 4,999,388, all of which are incorporated herein by reference.

The polyesters are polycondensation products of an aromatic dicarboxylic acid and a dihydric alcohol. The aromatic dicarboxylic acids include terephthalic acid, isophthalic acid, 4,4'-diphenyl-dicarboxylic acid, 2,6-naphthalenedicarboxylic acid, and the like. Dihydric alcohols include the lower alkane diols with from two to about 10 carbon atoms such as, for example, ethylene glycol, propylene glycol, cyclohexanedimethanol, and the like. Some illustrative nonlimiting examples of polyesters include polyethylene terephthalate, polybutylene terephthalate, polyethylene isophthalate, and poly(1,4-cyclohexanedimethylene terephthalate). They are disclosed in U.S. Pat. Nos. 2,465,319; 2,901,466 and 3,047,539, all of which are incorporated herein by reference.

The polyacrylates and polymethacrylates are polymers or resins resulting from the polymerization of one or more acrylates such as, for example, methyl acrylate, ethyl acrylate, butyl acrylate, 2-ethylhexyl acrylate, etc., as well as the methacrylates such as, for instance, methyl methacrylate, ethyl methacrylate, butyl methacrylate, hexyl methacrylate, etc. Copolymers of the above acrylate and methacrylate monomers are also included within the term "polyacrylates or polymethacrylates" as it appears herein. The polymerization of the monomeric acrylates and methacrylates to provide the polyacrylate resins useful in the practice of the invention may be accomplished by any of the well known polymerization techniques.

The styrene-acrylonitrile and acrylonitrile-butadiene-styrene resins and their preparation are disclosed, inter alia, in U.S. Pat. Nos. 2,769,804; 2,989,517; 2,739,142; 3,991,136 and 4,387,179, all of which are incorporated herein by reference.

The alkyd resins are disclosed in "Alkyd Resin Technology", Patton, Interscience Publishers, NY, N.Y., 1962, and in U.S. Pat. Nos. 3,102,866; 3,228,787 and 4,511,692, all of which are incorporated herein by reference.

These polymeric materials may optionally contain the conventional and well known fillers such as mica, talc and glass fibers.

The polymeric layer or basecoat 20 may be applied onto the surface of the substrate by any of the well known and conventional methods such as dipping, spraying and brushing.

The polymeric layer 20 functions, inter alia, to level the surface of the substrate, cover any scratches or imperfections in the surface and provide a smooth and even surface for the deposition of the chrome/nickel alloy layer.

The polymeric layer 20 has a thickness at least effective to level out the surface of the substrate. Generally, this thickness is from about 0.1 mil to about 10 mils, preferably from about 0.2 mil to about 5 mils, and more preferably from about 0.3 mils to about 1.5 mils.

The chrome/nickel alloy layer 21 may be deposited on the plastic layer 20 by any of the conventional and well known chrome deposition techniques including vapor deposition such as physical vapor deposition and electroplating techniques. The electroplating techniques along with various chrome/nickel plating baths are disclosed in Brassard, "Decorative Electroplating—A Process in Transition", Metal Finishing, June 1988; Zaki, "Chromium Plating", PF Directory; and in U.S. Pat. Nos. 4,460,438, 4,234,396 and 4,093,522, all of which are incorporated herein by reference.

Chrome/nickel plating baths are well known, conventional and commercially available. A typical chrome/nickel plating bath contains chromic acid or salts thereof, and catalyst ion such as sulfate or fluoride. The catalyst ions can be provided by sulfuric acid or its salts and fluosilicic acid. The baths also may contain nickel sulfate, nickel chloride and boric acid. These baths can include a number of well known and conventionally used compounds such as leveling agents, brighteners, and the like. The baths may be operated at a temperature of about 112°–116° F. Typically in chrome/nickel plating a current density of about 150 amps per square foot, at about five to nine volts is utilized.

The vapor deposition of the chrome/nickel alloy is conventional and well known in the art and includes techniques such as cathodic arc evaporation (CAE) or sputtering. Sputtering techniques and equipment are disclosed, inter alia, in J. Vossen and W. Kern "Thin film Processes II", Academic Press, 1991; R. Boxman et al, "Handbook of Vacuum Arc Science and Technology", Noyes Pub., 1995; and U.S. Pat. Nos. 4,162,954 and 4,591,418, all of which are incorporated herein by reference.

Briefly, in the sputtering deposition process a metal (i.e., chrome/nickel alloy) target, which is the cathode, and the substrate are placed in a vacuum chamber. The air in the chamber is evacuated to produce vacuum conditions in the chamber. An inert gas, such as Argon, is introduced into the chamber. The gas particles are ionized and are accelerated to the target to dislodge chrome and nickel atoms. The dislodged target material is then typically deposited as a coating film on the substrate.

In cathodic arc evaporation, an electric arc of typically several hundred amperes is struck on the surface of a metal cathode such as chrome/nickel alloy. The arc vaporizes the cathode material, which then condenses on the substrates forming a coating.

The chrome/nickel alloy which comprises layer 21 generally contains, in percent by weight, from about 5% to about 95% nickel and from about 95% to about 5% chrome, preferably from about 50% to about 90% nickel and from about 10% to about 50% chrome, and more preferably from about 70% to about 90% nickel and from about 10% to about 30% chrome.

The thickness of the chrome/nickel alloy layer 21 is at least a thickness effective to provide a decorative appearance to the article. Generally this thickness is from about 200 Angstroms to about 35 microns, preferably from about 400 Angstroms to about 5,000 Angstroms.

The top coat 22 which is applied over the chrome/nickel alloy layer should ideally be weather resistant, impact resistant, abrasion resistant, flexible and transparent. The term "transparent" is defined as a coating through which the chrome layer can be seen. It is preferred that the transparent coating be substantially colorless so that the esthetic effects of the chrome layer are not substantially decreased. However, in some instances the addition of color to the transparent layer can be esthetically beneficial. Polymeric or resinous coating material which exhibit good mixture of all of these properties are polyurethanes, polyacrylates and polymethacrylates. Of these polyurethanes are generally preferred as they exhibit a particularly good blend of all of these properties.

Polyurethanes are well known in the art and are readily commercially available. Various known polyols and polyisocyanates are used to form polyurethanes. Polyurethanes are useful as coatings and are described, for example, in Chapter X, Coatings, pp. 453–607 in J. H. Saunders and K. C. Frisch, Polyurethanes: Chemistry and Technology, Part II, Interscience Publishers (N.Y., 1964), incorporated herein by reference.

Suitable polyurethanes may be prepared in a conventional manner such as by reacting polyols or hydroxylated polymers with organic polyisocyanates in the manner well known in the art. Suitable organic polyisocyanates include, for instance, ethylene diisocyanate; ethylidene diisocyanate; propylene-1,2-diisocyanate; cyclohexylene-1,2-diisocyanate; m-phenylene diisocyanate; 2,4-toluene diisocyanate; 2,6-toluene diisocyanate; 3,3'-dimethyl-4,4'-biphenylene diisocyanate; p,p',p"-triphenylmethane triisoene diisocyanate; 3,3'-diphenyl-4,4'-biphenylene diisocyanate; 4,4'-biphenylene diisocyanate; 3,3'-dichloro-4,4-biphenylene diisocyanate; p.p',p"-triphenylmethane triisocyanate; 1,5-mepthalene diisocyanate; furfurylidene diisocyanate or polyisocyanates, in a blocked or inactive form such as the bisphenyl carbamates of 2,4- or 2,6-toluene diisocyanate; p.p'-diphenyl methane diisocyanate; p-phenylene diisocyanate; 1,5-napthalene diisocyanate and the like. It is preferred to use a commercially available mixture of toluene diisocyanates which contains 80 percent 2,4-toluene diisocyanate and 20 percent 2,6-toluene diisocyanate or 4,4-diphenylmethane diisocyanate.

Polyurethanes applied as coatings in accordance with the invention may, of course, be in the form of solutions in suitable solvents such as xylene, toluene, methyl ethyl ketone, butanol, butyl acetate, etc.

Materials for the polyurethane coatings may be supplied in one package or two package prepolymer systems or oil modified systems, etc., all in the manner well known in the industry. Such materials are described for instance in the pamphlet "Urethane Coatings", published by the Federation of Societies for Paint Technology (1970). Radiation-curable urethane coatings may also of course be used.

Some illustrative examples of suitable polyurethane compositions are disclosed in U.S. Pat. Nos. 4,699,814; 4,681, 811; 4,703,101; 4,403,003 and 5,268,215, all of which are incorporated herein by reference.

Another suitable type of polyurethane is an acrylic polyurethane. The acrylic polyurethanes are described in U.S. Pat. Nos. 3,558,564; 4,131,571 and 4,555,535, all of which are incorporated herein by reference.

Upon the application of the top coat 22 on chrome/nickel alloy layer 21, layer 21 assumes the appearance of black chrome, i.e., a deep, lustrous, dark, shiny appearance. Absent layer 22 the chrome/nickel layer 21 does not assume the appearance of black chrome. Thus, layer 22 serves the dual function of protecting layer 21 and giving it the appearance of black chrome.

The thickness of layer 22 is a thickness at least effective to protect the underlying chrome/nickel alloy layer and to give it the appearance of black chrome. Generally this thickness is from about 0.05 mil to about 10 mils, preferably from about 0.1 mil to about 3 mils and more preferably from about 0.3 mil to about 1.5 mils.

In order that the invention may be more readily understood the following example is provided. The example is illustrative and does not limit the invention thereto.

EXAMPLE 1

A steel substrate is ultrasonically cleaned and then heated at 250° F. to remove moisture. A basecoat polymeric layer is applied onto the cleaned and dried steel substrate by a standard and conventional high volume low pressure gun. The polymer is comprised of 35 weight percent styrenated acrylic resin, 30 weight percent melamine formaldehyde resin, and 35 weight percent bisphenol A epoxy resin. The polymer is dissolved in sufficient solvents to provide a polymeric composition containing about 43 weight percent solids. After the basecoat is applied onto the substrate the substrate is allowed to sit for 20 minutes for ambient solvent flash off. The substrate is then baked at 375° F. for 2 hours. The resulting cured polymeric basecoat has a thickness of about 0.8 mil.

The nickel/chrome alloy layer is deposited by filament evaporation deposition. The basecoated substrate is placed on a metallizing rack which is placed on a metallizing carriage. The metallizing carriage is placed into a vacuum chamber which is evacuated down to a vacuum level of 5×10E−5 torr. The metallizing carriage has two bus bars which hold 40 tungsten filaments. Each tungsten filament holds one nickel/chrome alloy (77 weight percent Ni, 16 weight percent Cr and 7 weight percent Fe) slug. As electric power is fed to the bus bars, the tungsten filaments are resistively heated. The slugs melt and evaporate and the slug material (nickel/chrome alloy) condenses on the rotating substrate. The thickness of the nickel/chrome alloy layer on the basecoated substrate is 400 Angstroms.

The nickel/chrome alloy coated substrate is removed from the vacuum chamber and a liquid topcoat composition is applied onto the nickel/chrome alloy layer by a standard and conventional high volume pressure gun. The liquid topcoat comprises about 50 weight percent solvent and a styrenated hydroxylated acrylic resin blended with hexamethylene diisocyanate to form an acrylated urethane. The substrate having the acrylated urethane composition thereon is allowed to sit at ambient temperature and pressure for 20 minutes to evaporate off some of the solvent. The substrate with the topcoat composition thereon is baked at 160° F. for 1 hour to cure the resinous composition. The thickness of the dry and cured resin topcoat is 1 mil. The substrate has a black chrome appearance and is resistant to abrasion and corrosion.

While certain embodiments of the invention have been described for purposes of illustration, it is to be understood that there may be other additional various embodiments and modifications within the general scope of the invention.

I claim:

1. An article having on at least a portion of its surface a multi-layer coating comprising;
    a layer comprised of polymeric material directly disposed on at least a portion of the surface of the article;
    a non-transparent layer comprised of chrome and nickel alloy directly disposed on said layer comprised of polmeric material; and
    a layer comprised of acrylic directly disposed on said layer comprised of chrome and nickel alloy.

2. The article of claim 1 wherein said polymeric material is selected from the group consisting of polycarbonate, polyacrylate, polymethacrylate, polyester, acrylonitrile-butadiene-styrene, nylon, polystyrene, styrene-butadiene, styrene-acrylonitrile, and blends and copolymers thereof.

3. The article of claim 1 wherein said article is comprised of metal.

4. The article of claim 1 wherein said article is comprised of metal alloy.

5. The article of claim 1 wherein said article is comprised of plastic.

6. The article of claim 1 wherein said article is part of the exterior of a motor vehicle.

7. The article of claim 6 wherein said article is a wheel cover.

8. An article comprised of metal or metal alloy having on at least a portion of its surface a multi-layer coating comprising:
    a layer comprised of polymeric material selected from the group consisting of polycarbonate, polyepoxy, alkyd, polyacrylate, polymethacrylate, acrylonitrile-butadienestyrene, nylon, polystyrene, styrene-butadiene, styrene-acrylonitrile, polypropylene, and blends and copolymers thereof directly on at least a portion of the surface of said article;
    a non-transparent layer comprised of chrome and nickel alloy directly on said layer comprised of polymeric material; and
    a layer comprised of acrylic directly on said layer comprised of chrome and nickel alloy.

9. An article having on at least a portion of its surface a multi-layer coating comprising:
    a layer comprised of polymeric material selected from the group consisting of polycarbonate, polyacrylate, polymethacrylate, nylon, alkyd, polyepoxy, acrylonitrile-butadiene-styrene, polystyrene, styrene-butadiene, styrene-acrylonitrile, polypropylene, and blends and copolymers thereof directly on at least a portion of the surface of said article;
    a non-transparent layer comprised of chrome and nickel alloy directly on said layer comprised of polymeric material; and
    a layer comprised of acrylic directly on said layer comprised of chrome and nickel alloy.

* * * * *